United States Patent
Tuchiya et al.

(10) Patent No.: US 6,603,341 B2
(45) Date of Patent: Aug. 5, 2003

(54) LOAD DRIVE CIRCUIT HAVING LOW VOLTAGE DETECTOR

(75) Inventors: Naoya Tuchiya, Nukata-gun (JP); Takeshi Ishikawa, Sakai (JP); Fukuo Ishikawa, Kariya (JP)

(73) Assignees: Denso Corporation, Kariya (JP); Anden Co., Ltd., Anjo (JP)

( * ) Notice: Subject to any disclaimer, the term of this patent is extended or adjusted under 35 U.S.C. 154(b) by 0 days.

(21) Appl. No.: 09/884,919

(22) Filed: Jun. 21, 2001

(65) Prior Publication Data

US 2002/0021150 A1 Feb. 21, 2002

(30) Foreign Application Priority Data

Jun. 22, 2000 (JP) .................................. 2000-187698

(51) Int. Cl.[7] .............................................. H03K 17/16
(52) U.S. Cl. ...................... 327/390; 327/419; 327/543; 307/139; 323/282
(58) Field of Search ................................ 327/365, 419, 327/429, 478, 574, 581, 72, 77, 143, 389, 390, 589, 536, 543, 198; 307/110, 139, 140, 141; 323/282, 284, 288, 349

(56) References Cited

U.S. PATENT DOCUMENTS

| | | | | |
|---|---|---|---|---|
| 5,426,334 A | * | 6/1995 | Skovmand | ................. 323/349 |
| 5,770,967 A | * | 6/1998 | Alzati et al. | ................. 327/365 |
| 5,914,589 A | * | 6/1999 | Erckert | ........................ 323/282 |
| 6,016,068 A | | 1/2000 | Ding | ........................... 327/142 |
| 6,140,806 A | * | 10/2000 | Gohara | ........................ 323/282 |

FOREIGN PATENT DOCUMENTS

| | | |
|---|---|---|
| JP | A-3-228426 | 10/1991 |
| JP | A-5-226995 | 9/1993 |
| JP | A-7-240677 | 9/1995 |
| JP | A-8-223017 | 8/1996 |
| JP | A-9-135157 | 5/1997 |
| JP | A-10-207580 | 8/1998 |
| JP | A-11-136109 | 5/1999 |
| JP | A-11-136110 | 5/1999 |
| JP | B2-2941400 | 6/1999 |

* cited by examiner

*Primary Examiner*—Minh Nguyen
(74) *Attorney, Agent, or Firm*—Posz & Bethards, PLC

(57) ABSTRACT

A charge pump circuit receives a battery voltage of a power line, and outputs a raising voltage proportional to the battery voltage. A low voltage detecting circuit detects a low voltage state in which a detecting voltage obtained by dividing the raising voltage. Thus, it is possible to indirectly detect a low voltage state in which the battery voltage is lower than a predetermined threshold value. When the low voltage state is detected, a drive circuit turns off a MOSFET. At this time, the battery voltage is temporarily varied, but the charge pump circuit has a filter action and a delay action, whereby temporary variation does not easily appear in the raising voltage (detecting voltage), and an error in operation of the MOSFET can be prevented.

17 Claims, 11 Drawing Sheets

LOAD DRIVE CIRCUIT HAVING LOW VOLTAGE DETECTOR

CROSS REFERENCE TO RELATED APPLICATION

This application is based upon Japanese Patent Application No. 2000-187698 filed on Jun. 22, 2000, the contents of which are incorporated herein by reference.

BACKGROUND OF THE INVENTION

1. Field of the Invention

The present invention relates to a load drive circuit having a charge pump circuit for raising a voltage, and a switch circuit for opening and closing a power supply path to a load by using this raised voltage.

2. Related Art

FIG. 10 shows the conventional construction of a load drive circuit for driving a load (a relay, a light, etc.) mounted to an automobile. The load drive circuit 1 is constructed by a MOSFET 4 for controlling a conducting state of the load 2, a drive circuit 6 for driving this MOSFET 4, a power circuit 8, a voltage raising (charge pump) circuit 5 for raising and outputting an inputted voltage, and a low voltage detecting circuit 7. The charge pump circuit 5, the drive circuit 6 and the low voltage detecting circuit 7 are activated by receiving the supply of a controlled power voltage from the power circuit 8 with a battery voltage Vb as an input.

The MOSFET 4 is interposed on a power line 3 (a power supply path) for connecting an unillustrated battery and the load 2. The charge pump circuit 5 inputs the battery voltage Vb on the power line 3, and outputs a raised voltage Vc. The drive circuit 6 receives the supply of the raised voltage Vc from this charge pump circuit 5, and operates the MOSFET 4 in accordance with a drive command signal Sd. The low voltage detecting circuit 7 is arranged to execute a function (a so-called power on reset function) for turning-off an output when the battery voltage Vb is a low voltage. For example, when the battery voltage Vb is lower than a predetermined threshold value Vd, the power circuit 8 cannot generate a stable control power voltage, so that the load drive circuit 1 is not operated normally. Therefore, the low voltage detecting circuit 7 detects the battery voltage Vb by a voltage dividing circuit arranged within this low voltage detecting circuit 7. When this detected voltage is lower than a reference voltage Vr corresponding to the threshold value Vd (in the case of a low voltage state), the low voltage detecting circuit 7 outputs a low voltage detecting signal Se at a high voltage level to the drive circuit 6. When the drive circuit 6 receives this low voltage detecting signal Se at a high voltage level, the drive circuit 6 turns off the MOSFET 4.

FIG. 11 shows a voltage waveform of each portion and a state of the low voltage detecting signal Se when the battery voltage Vb becomes lower than the threshold value Vd and is then raised in a providing state of the drive command signal Sd for instructing turning-on of the MOSFET 4. Here, the voltage waveform of each portion is set as follows.

Waveform A (thick solid line): battery voltage Vb

Waveform B (thick solid line): detecting voltage Va obtained by dividing battery voltage Vb Waveform C (thin solid line): output voltage Vo In FIG. 11, since the battery voltage Vb (detecting voltage Va) is equal to or greater than the threshold value Vd (reference voltage Vr) before a time t1, the low voltage detecting circuit 7 outputs the low voltage detecting signal Se at a low voltage level, and the drive circuit 6 continuously turns on the MOSFET 4. In this case, the output voltage Vo (a source voltage of the MOSFET 4) is lower than the battery voltage Vb by the voltage between a gate and a source of the MOSFET 4, and an electric current flows from the battery to the load 2 through the power line 3 and the MOSFET 4.

When the time t1 has shortly passed and the battery voltage Vb (detecting voltage Va) is lower than the threshold value Vd (reference voltage Vr), the low voltage detecting circuit 7 sets the low voltage detecting signal Se from the low voltage level to a high voltage level so that the drive circuit 6 turns off the MOSFET 4. When the MOSFET 4 is turned off, the electric current flowing to the load 2 is interrupted, and the output voltage Vo is reduced to 0 V (earth electric potential).

At this time, the electric current flowing through the power line 3 from the battery is suddenly reduced. Therefore, for example, the battery voltage Vb detected in the load drive circuit 1 is temporarily jumped up by an inductance component on the power line 3, and exceeds the threshold value Vd. As a result, the low voltage detecting signal Se becomes the low voltage level, and the drive circuit 6 again turns on the MOSFET 4. When the electric current flowing through the power line 3 is suddenly increased by turning on the MOSFET 4, the battery voltage Vb becomes lower than the threshold value Vd, and the low voltage detecting signal Se becomes the high voltage level. Accordingly, the drive circuit 6 again turns off the MOSFET 4.

The MOSFET 4 finally lapses into an oscillating state repeating turning-on and turning-off by the jumping-up of the battery voltage Vb caused in the turning-off of the MOSFET 4 while the battery voltage Vb becomes higher than the threshold value Vd (period T1). This phenomenon is similarly caused when the battery voltage exceeds the threshold value Vd in a raising process of the battery voltage Vb (a period T2 from a time t2).

When the MOSFET 4 falls into the oscillating state, switching loss of the MOSFET 4 is increased and surge voltage is generated. Therefore, it is necessary to adopt an element of large allowable loss and an element of high withstand voltage so that cost is increased and parts are large-sized. Further, in a period in which the MOSFET 4 is in the oscillating state, there may be a problem that chattering is generated in a relay switch when the load 2 is a relay coil. When the load 2 is a light, there may be also a problem that the light is turned on and off.

For example, it is considered as a means for preventing the generation of such an oscillating state that hysteresis characteristics are added to a comparison circuit of the detecting voltage Va and the reference voltage Vr in the low voltage detecting circuit 7. In this case, since the above jumping-up voltage width is considerably large, a hysteresis width constructed by lower and upper threshold values is correspondingly set to be wide.

It is necessary to set the lower threshold value to the threshold value Vd to reliably turn off the MOSFET 4 in a period in which the battery voltage Vb is lower than the predetermined threshold value Vd as a function for interrupting an output when the voltage is low. When the battery voltage Vb lies between the lower and upper threshold values (in a hysteresis voltage area), the MOSFET 4 attains the turning-off state at a raising state of the battery voltage Vb, and attains the turning-on state at a lowering state of the battery voltage Vb. Accordingly, it has became apparent that a minimum operating voltage of the load drive circuit 1 capable of performing turning-on and turning-off operations of the MOSFET 4 in accordance with the drive command signal Sd is increased.

In view of the above situations, an object of the present invention is to provide a reliable load drive circuit having a low voltage time output off function and preferably operated even when the load drive circuit is arranged in a power supply path in which a power voltage is temporarily changed by a sudden change in a load electric current.

SUMMARY OF THE INVENTION

In accordance with the present application invention in a first aspect, a load drive circuit is characterized in that the load drive circuit comprises:

a charge pump circuit for inputting a power voltage and outputting a raised voltage;

a switch circuit arranged in a power supply path for connecting a power source and a load, and setting said power supply path to an opening state or a closing state in accordance with a drive command signal in a supply state of an output voltage of said charge pump circuit; and a low voltage detecting circuit for detecting the output voltage of said charge pump circuit as a low voltage state when this output voltage of said charge pump circuit is lower than a predetermined judging level;

wherein said switch circuit is constructed such that said switch circuit sets said power supply path to the opening state irrespective of said drive command signal in a period in which said low voltage detecting circuit detects said low voltage state.

Accordingly, the switch circuit is operated such that the power supply path is set to the opening or closing state in accordance with the drive command signal in a state in which the output voltage of the charge pump circuit is supplied. The charge pump circuit generally has a construction in which a charging circuit constructed by a diode and a capacitor for preventing the back flow of electric charges is in a cascade connection by a required stage number. Further, constant voltage control is not performed.

In such a construction, the charge pump circuit outputs the raising voltage according (e.g., proportional) to the inputted power voltage. In the charge pump circuit, the electric charges are sequentially moved from the charging circuit located on an input side to the charging circuit located on an output side, so that a delay occurs until a variation of the inputted power voltage appears in the output. Further, the voltage variation appearing in the output of the charge pump circuit is small in comparison with the variation of the inputted power voltage by an action of the capacitor as a low pass filter. Further, the diode for preventing the back flow of electric charges exists in the charging circuit. Therefore, temporary reduction in the inputted power voltage does not easily appear in the output.

As a result, the low voltage detecting circuit can indirectly detect the low voltage state of the power voltage by detecting the low voltage state with respect to the output voltage of the charge pump circuit. The switch circuit sets the power supply path to the opening state irrespective of the drive command signal in a detecting period of this low voltage state. Accordingly, it is possible to prevent the generations of an unstable operation of the load drive circuit and an error in the operation caused by a reduction in the power voltage so that the load drive circuit and the load can be protected (low voltage time output off function).

An inductance component generally exists in the power supply path. Accordingly, when the switch circuit energizes and de-energizes the load by opening and closing the power supply path, a phenomenon of temporarily varying the voltage of the power supply path is caused. In contrast to this, the present means does not directly detect the voltage of the power supply path, but indirectly detects this voltage through the output voltage of the charge pump circuit. Accordingly, temporary voltage variation generated in turning the load on and off is not easily detected by the above characteristics of the charge pump circuit. As a result, when the power voltage is reduced and is lower than a threshold value, it is possible to prevent the generation of an oscillating state alternately repeating the opening and closing operations of the power supply path due to the switch circuit without separately arranging a filter circuit.

Further, in accordance with the present means, it is not necessary to add hysteresis to prevent the temporary voltage variation caused by the opening and closing operations of the power supply path so that a minimum operation voltage can be set to be low.

These and other objects, features and characteristics of the present invention will be appreciated from a study of the following detailed description, the appended claims, and drawings, all of which form parts of this application. In the drawings, same portions or corresponding portions are put the same numerals each other to eliminate redundant explanation.

DESCRIPTION OF THE PREFERRED EMBODIMENTS (First Embodiment)

A first embodiment of the present invention will next be explained with reference to FIGS. 1 to 3.

Figure 1:
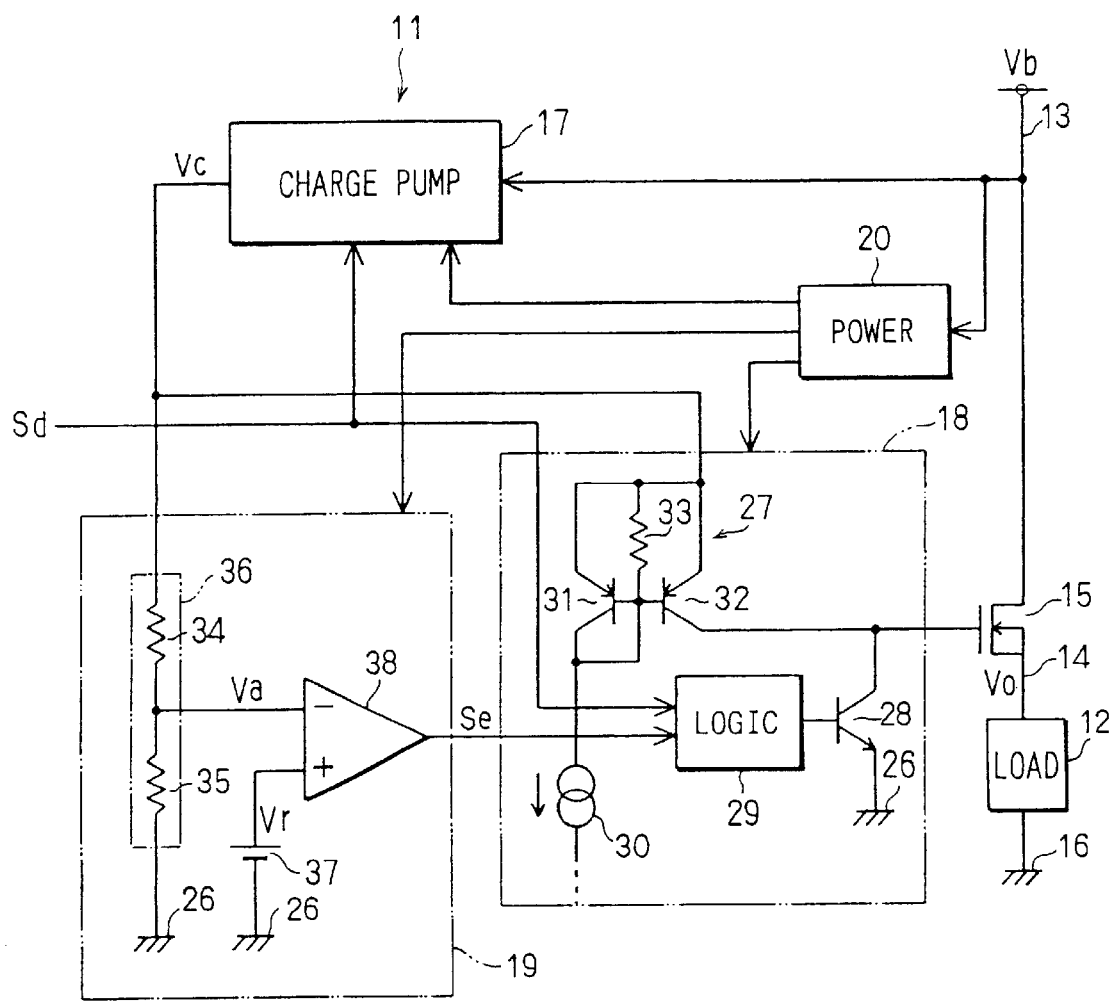
FIG. 1 is a circuit diagram of the electric construction of a load drive circuit showing a first embodiment of the present invention.
Figure 2:
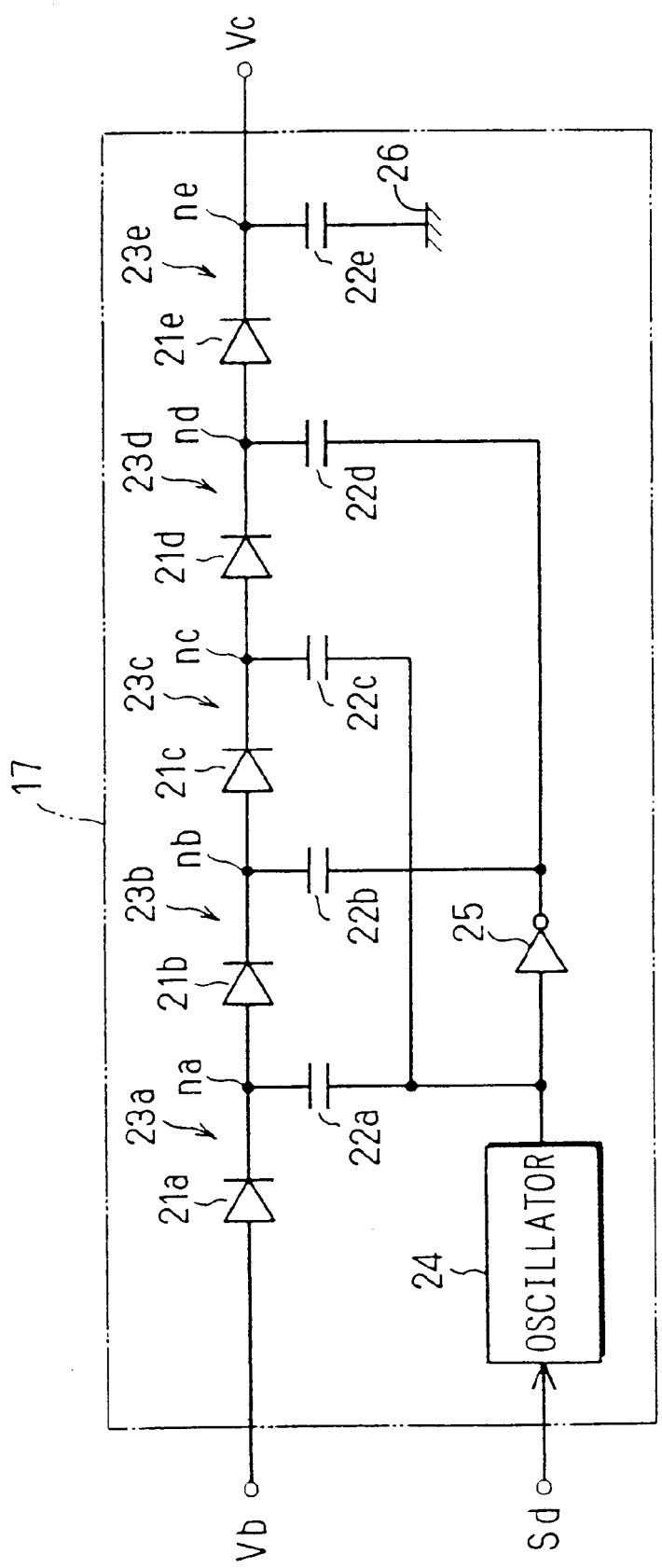
FIG. 2 is an electric construction of a charge pump circuit.

FIG. 1 schematically shows the electric construction of a load drive circuit. In this FIG. 1, a load drive circuit 11 is mounted to an automobile, and controls turning-on and turning-off of an electric current flowing to a load 12 (a relay, a light, etc.) from an unillustrated battery (corresponding to a power source).

The load drive circuit 11 is constructed by containing a charge pump circuit 17, a drive circuit 18 and a low voltage detecting circuit 19 in addition to a MOSFET 15.

An N-channel type MOSFET 15 (corresponding to a switching element) is arranged between a power line 13 connected to a positive side terminal of a battery and an output line 14 connected to one terminal of the load 12. A drain and a source of the MOSFET 15 are respectively connected to the power line 13 and the output line 14. The MOSFET 15 is operated as a high side switch with respect to the load 12. The other terminal of the load 12 is connected to a negative side terminal of the battery through a car body earth 16. Here, the power line 13 and the output line 14 are respectively set to an input line and an output line of the load drive circuit 11, and both the power line 13 and the output line 14 correspond to a power supply path in the present invention.

A power supply circuit 20 inputs a battery voltage Vb from the power line 13, and generates a control power voltage. The charge pump circuit 17, the drive circuit 18 and the low voltage detecting circuit 19 are operated by receiving the supply of the control power voltage from the power supply circuit 20. The MOSFET 15 and the drive circuit 18 correspond to a switch circuit in the present invention, and the drive circuit 18 corresponds to an element drive circuit.

The charge pump circuit 17 raises the battery voltage Vb inputted from the power line 13, and outputs a raised voltage Vc. The charge pump circuit 17 concretely has a well known construction shown in FIG. 2. In FIG. 2, the charge pump circuit 17 is constructed by sequentially cascade connecting a charging circuit 23a constructed by a diode 21a and a capacitor 22a, a charging circuit 23b constructed by a diode 21b and a capacitor 22b, . . . , a charging circuit 23e constructed by a diode 21e and a capacitor 22e. Here, the diodes 21a, 21b, . . . , 21e are respectively arranged such that electric charges charged to the capacitors 22a, 22b, . . . , 22e do not flow backward in an input side direction (previous stage direction). These diodes are connected in series with an input side as an anode and an output side as a cathode.

A drive command signal Sd for instructing on and off states of the MOSFET 15 is outputted from an unillustrated CPU. The drive command signal Sd at a high voltage level instructs the on state of the MOSFET 15, and the drive command signal Sd at a low voltage level instructs the off state of the MOSFET 15.

An oscillating circuit 24 outputs a raising operation voltage of a rectangular wave shape having a predetermined frequency in a period in which the drive command signal Sd has a high voltage level. This raising operation voltage is provided to a reference side terminal (a terminal on a side opposed to a terminal connected to each of diodes 21a, 21c) of each of capacitors 22a, 22c. The raising operation voltage is also provided to a reference side terminal of each of capacitors 22b, 22d after the raising operation voltage is set to an inverted signal through an inverter 25. The reference side terminal of the capacitor 22e is connected to a ground terminal 26 (an electric potential of 0 V) connected to a negative side terminal of the battery.

In accordance with this construction, the charge pump circuit 17 performs a voltage raising operation in a period in which the drive command signal Sd has a high voltage level. The charge pump circuit 17 stops the voltage raising operation in a period in which the drive command signal Sd has a low voltage level. When an amplitude of the raising operation voltage is set to vg (a constant value) and an electric current outputted from the charge pump circuit 17 is sufficiently small, the voltages of nodes na, nb, . . . , ne (output terminals) shown in FIG. 2 respectively become battery voltages vb, Vb+Vg, . . . , Vb+4·Vg (=raising voltage Vc). Accordingly, the raising voltage Vc is approximately proportional to the battery voltage Vb inputted from the power line 13. The amplitude Vg and the frequency of the raising operation voltage are determined such that the raising voltage Vc becomes a voltage higher than the battery voltage Vb by at least the voltage between the gate and the source of the MOSFET 15 or more.

Since the MOSFET 15 is turned off in the low voltage level period of the drive command signal Sd, raising voltage Vc is not required and the voltage raising operation is stopped to reduce power consumption of the battery. Thus, it is also possible to remove the consumption of an operation electric current (a dark current) flowing to the charge pump circuit 17.

The drive circuit 18 shown in FIG. 1 is constructed by a constant electric current circuit 27, an NPN type transistor 28, a logic circuit 29, etc. The constant electric current circuit 27 is connected between an output terminal of the charge pump circuit 17 and the gate of the MOSFET 15. The transistor 28 is connected between the gate of the MOSFET 15 and the ground terminal 26. The logic circuit 29 operates the transistor 28 in accordance with the voltage level of the drive command signal Sd.

The logic circuit 29 operates the transistor 28 on the basis of the voltage level of each of the drive command signal Sd and a low voltage detecting signal Se described later. The logic circuit 29 turns off the transistor 28 only when the drive command signal Sd has a high voltage level and the low voltage detecting signal Se has a low voltage level.

The constant electric current circuit 27 is constructed by a constant electric current source 30 and a current mirror circuit constructed by PNP type transistors 31, 32. Emitters of the transistors 31, 32 are connected to the output terminal of the charge pump circuit 17, and collectors of the transistors 31, 32 are respectively connected to the constant electric current source 30 and the gate of the MOSFET 15. A resistor 33 is connected between the emitters and the bases of the transistors 31, 32. When the low voltage detecting signal Se has a high voltage level, the constant electric current source 30 stops its operation.

In accordance with this construction, when the drive command signal Sd has a high voltage level and the low voltage detecting signal Se has a low voltage level, a voltage approximately equal to the raising voltage Vc is applied to the gate of the MOSFET 15 so that the MOSFET 15 is turned on. In a case except for this case, the gate of the MOSFET 15 is set to a ground electric potential so that the MOSFET 15 is turned off.

The low voltage detecting circuit 19 determines whether the raising voltage Vc of the charge pump circuit 17 is lower than a predetermined threshold value Vt (corresponding to a judging level). The low voltage detecting circuit 19 then outputs the low voltage detecting signal Se as results of this determination to the drive circuit 18.

The low voltage detecting circuit 19 is concretely constructed by a voltage dividing circuit 36 (corresponding to a voltage detecting circuit and a resistor voltage dividing circuit), a reference voltage generating circuit 37 and a comparator 38 (corresponding to a comparing circuit). The voltage dividing circuit 36 is constructed by resistors 34, 35 connected in series between the output terminal of the charge pump circuit 17 and the ground terminal 26. The reference voltage generating circuit 37 generates a reference voltage Vr. The reference voltage Vr and a detecting voltage Va outputted from the voltage dividing circuit 36 are respectively inputted to a non-inversion input terminal and an inversion input terminal of the comparator 38. The comparator 38 then compares the detecting voltage Va and the reference voltage Vr. Further, the low voltage detecting signal Se is outputted from an output terminal of the comparator 38. The reference voltage generating circuit 37 is constructed by a band gap regulator and a Zener diode.

In the construction of the load drive circuit 11 explained above, the charge pump circuit 17 (except for capacitors 22a to 22e), the drive circuit 18 and the low voltage detecting circuit 19 are constructed as one IC.

An operation of the load drive circuit in this embodiment will next be explained further with reference to FIG. 3.

The load drive circuit 11 has a low voltage time output off function (a so-called power on reset function) by the above construction. Namely, when the battery voltage Vb on the power line 13 becomes a state of a low voltage lower than a predetermined threshold value Vd, for example, power supply circuit 20 cannot generate a stable control power voltage so that the charge pump circuit 17 and the drive circuit 18 of the load drive circuit 11, etc. are not normally operated. In such a state, even when the drive circuit 18 turns on the MOSFET 15, constant electric current circuit 27 is not sufficiently operated and the raising voltage Vc becomes insufficient so that turning-on state of the MOSFET 15 cannot be stably maintained in a linear area.

Therefore, the low voltage detecting circuit 19 detects the above low voltage state, and the drive circuit 18 turns off the MOSFET 15 in a detecting period of this low voltage state. Thus, the above unstable turning-on state can be prevented.

In this case, the raising voltage Vc outputted from the charge pump circuit 17 is approximately proportional to the power voltage Vb as mentioned above. Therefore, the power voltage Vb can be indirectly detected by detecting the raising voltage Vc. Accordingly, when the threshold value Vt of the raising voltage Vc of the charge pump circuit 17 is set to a value corresponding to the threshold value Vd of the power voltage Vb, the low voltage detecting circuit 19 detects a low voltage state in which the raising voltage Vc is lower than the threshold value Vt. Thus, the low voltage detecting circuit 19 can indirectly detect the low voltage state in which the battery voltage Vb is lower than the threshold value Vd.

In the low voltage detecting circuit 19, the voltage dividing circuit 36 obtains a detecting voltage Va by dividing the raising voltage Vc in a voltage dividing ratio determined by resistance values of the resistors 34 and 35. The reference voltage generating circuit 37 generates a reference voltage Vr having a voltage value provided when the threshold value Vt is divided in the voltage dividing ratio. As a result, when the low voltage state is set, the low voltage detecting signal Se outputted from the comparator 38 becomes a high voltage level.

This low voltage time output off function will next be explained further concretely. FIG. 3 shows a voltage waveform of each portion and a state of the low voltage detecting signal Se when the drive command signal Sd has a high voltage level and the battery voltage Vb is lowered near the threshold value Vd and is then raised. In FIG. 3, the voltage waveform of each portion is set as follows.

Waveform A (solid line): battery voltage Vb

Waveform B (solid line): raising voltage Vc

Waveform C (solid line): output voltage Vo (voltage of output line 14)

Waveform D (solid line): detecting voltage Va

Figure 3:
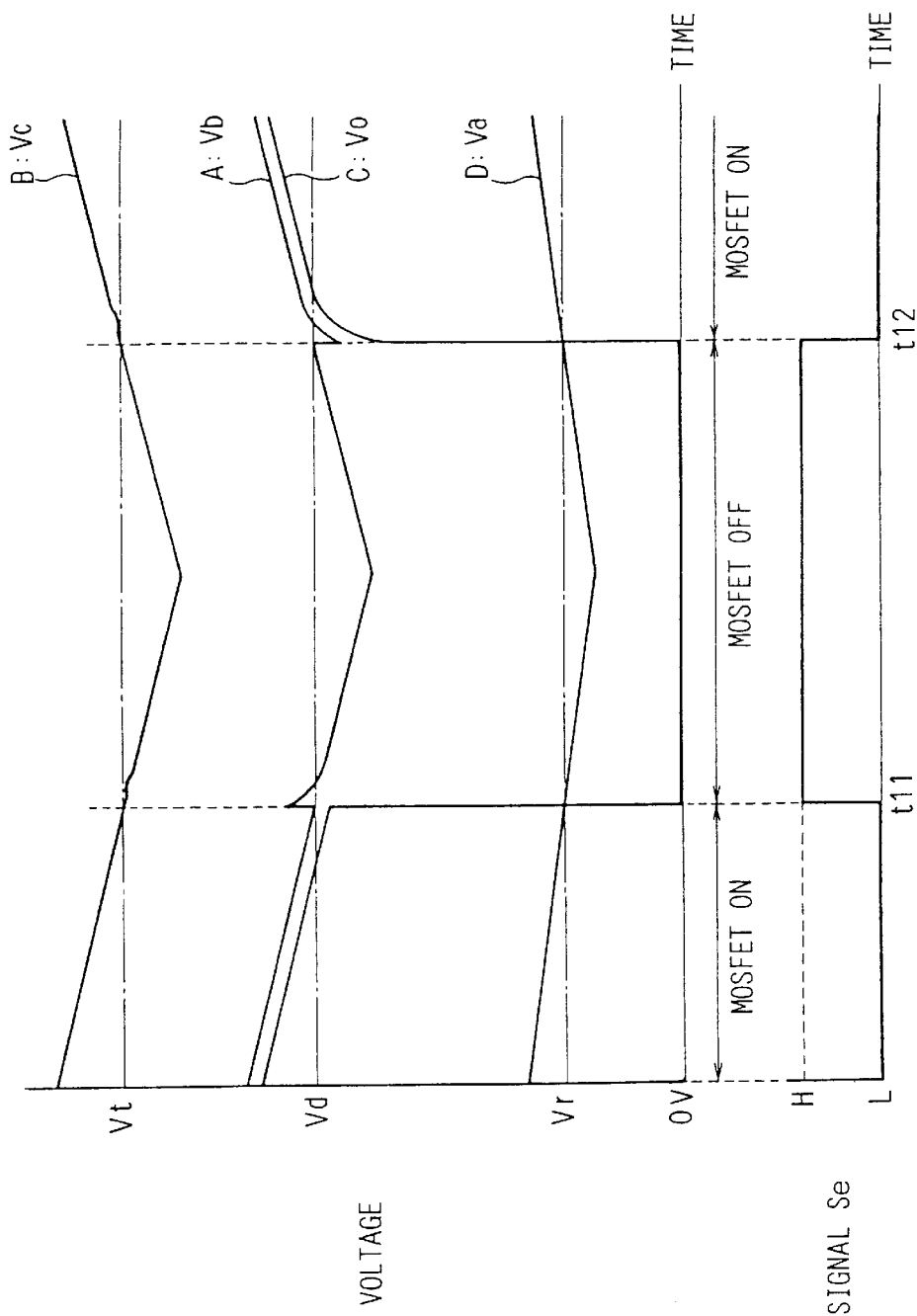
FIG. 3 is a voltage waveform of each portion and a state of a low voltage detecting signal Se when a drive command signal Sd has a high voltage level and a battery voltage Vb is lowered and raised near a threshold value Vd in the first embodiment.

Since the drive command signal Sd has a high voltage level in FIG. 3, the charge pump circuit 17 performs a voltage raising operation and outputs the raising voltage Vc. The battery voltage Vb is equal to or greater than the threshold value Vd before a time t11. Accordingly, the raising voltage Vc (detecting voltage Va) is also equal to or greater than the threshold value Vt (reference voltage Vr). The low voltage detecting circuit 19 outputs the low voltage detecting signal Se at a low voltage level, and the drive circuit 18 is operated such that the MOSFET 15 becomes a turning-on state. At this time, the output voltage Vo is lower than the battery voltage Vb by the voltage between the gate and the source of the MOSFET 15.

When the time t11 has then passed and the battery voltage Vb becomes lower than the threshold value Vd, the raising voltage Vc (detecting voltage Va) becomes lower than the threshold value Vt (reference voltage Vr). Accordingly, the low voltage detecting circuit 19 outputs the low voltage detecting signal Se at a high voltage level, and the drive circuit 18 turns off the MOSFET 15 although the drive command signal Sd has a high voltage level.

When the MOSFET 15 is turned off, an electric current flowing from the battery to the load 12 through the power line 13 is suddenly reduced so that the output voltage Vo is suddenly reduced toward 0 V. Further, the voltage (battery voltage Vb) of the power line 13 in the load drive circuit 11 is temporarily jumped up by the influence of an inductance component on the power line 13, etc.

Since the charge pump circuit 17 generates the raising voltage Vc with the battery voltage Vb as an input, the raising voltage Vc is also slightly raised by this jumping-up. However, since the capacitors 22a to 22e act as a low pass filter in the charge pump circuit 17, a voltage variation appearing in the raising voltage Vc is sufficiently small in comparison with the voltage variation of the battery voltage Vb. Further, since electric charges are sequentially moved from the charging circuit 23a located on an input side to the charging circuit 23e located on an output side, a slight delay exists until the variation of the inputted power voltage Vb appears in the raising voltage Vc.

Accordingly, even when the raising voltage Vc (detecting voltage Va) is gradually reduced and is smaller than the threshold value Vt (reference voltage Vr) and the MOSFET 15 becomes a turning-off state, phenomenon of raising the raising voltage Vc (detecting voltage Va) by the jumping-up of the battery voltage Vb and exceeding the threshold value Vt (reference voltage Vr) is not easily caused just after this turning-off state of the MOSFET 15. As a result, oscillating state alternately repeating turning on and off of the MOSFET 15 is not easily caused.

Thereafter, the MOSFET 15 is continuously turned off since the battery voltage Vb is lower than the threshold value Vd in a period until a time t12. When the battery voltage Vb is equal to or greater than the threshold value Vd at the time t12, the raising voltage Vc (detecting voltage Va) is equal to or greater than the threshold value Vt (reference voltage Vr). Accordingly, the low voltage detecting circuit 19 outputs the low voltage detecting signal Se at a low voltage level, and the drive circuit 18 turns on the MOSFET 15 (since the drive command signal Sd has a high voltage level).

At this time, since the electric current flowing to the load 12 is suddenly increased, the output voltage Vo is suddenly raised, and the voltage (battery voltage Vb) of the power line 13 in the load drive circuit 11 is temporarily jumped down. In this case, for reasons similar to those in the above jumping-up case, a voltage variation appearing in the raising voltage Vc appears delayingly in comparison with the voltage variation of the battery voltage Vb, and is further sufficiently reduced. Further, the diodes 21a to 21e for preventing the back flow of electric charges exist in the charge pump circuit 17. Therefore, when the voltage of the power line 13 is particularly jumped down, its variation does not easily appear in the raising voltage Vc. Accordingly, the above oscillating state is also not easily generated at this time t12.

As mentioned above, the load drive circuit 11 of this embodiment has the low voltage detecting circuit 19 for detecting a reduction in the battery voltage Vb in addition to the MOSFET 15 operated as a high side switch, the charge pump circuit 17 and the drive circuit 18. As a result, the low voltage time output off function for turning off the MOSFET 15 is performed in a detecting period of the low voltage state. Therefore, it is possible to prevent an unstable operation in which the MOSFET 15 is turned on in a saturation area and the on-off state is undetermined.

In this case, the low voltage detecting circuit 19 indirectly detects the low voltage state of the battery voltage Vb by detecting the low voltage state with respect to the raising voltage Vc of the charge pump circuit 17 having a filter action and a delay action. Therefore, even when the battery voltage Vb is temporarily varied as the on-off driving state of the MOSFET 15 is changed at a detecting start time point or a detecting termination time point of the low voltage state, this variation is not easily detected without separately adding a filter circuit, etc. As a result, it is possible to prevent the generation of an oscillating state alternately repeating turning-on and turning-off of the MOSFET 15, and the output voltage Vo can be stably controlled, and a reliable low voltage time output off function can be obtained.

Thus, chattering is not generated in a relay switch (when the load 12 is a relay coil), or light does not flash on and off (when the load 12 is a light). Further, with respect to the MOSFET 15, it is possible to prevent an increase in switching loss and the generation of a surge voltage.

Further, since hysteresis is not added to the comparator 38 for detecting the low voltage state, the voltage of a threshold value (Vd in this embodiment) in the low voltage state of the battery voltage Vb is reduced and a minimum operating voltage can be set to be low.

Further, since the low voltage detecting circuit 19 detects the raising voltage Vc outputted from the charge pump circuit 17, it is possible to monitor a reduction in the raising voltage Vc due to breakdown of the charge pump circuit 17. Therefore, the MOSFET 15 can be set to a turning-off state when the charge pump circuit 17 is broken.

(Second Embodiment)

A second embodiment of the invention will next be explained with respect to constructional portions different from those in the first embodiment with reference to FIGS. 4 and 5.

Figure 4:
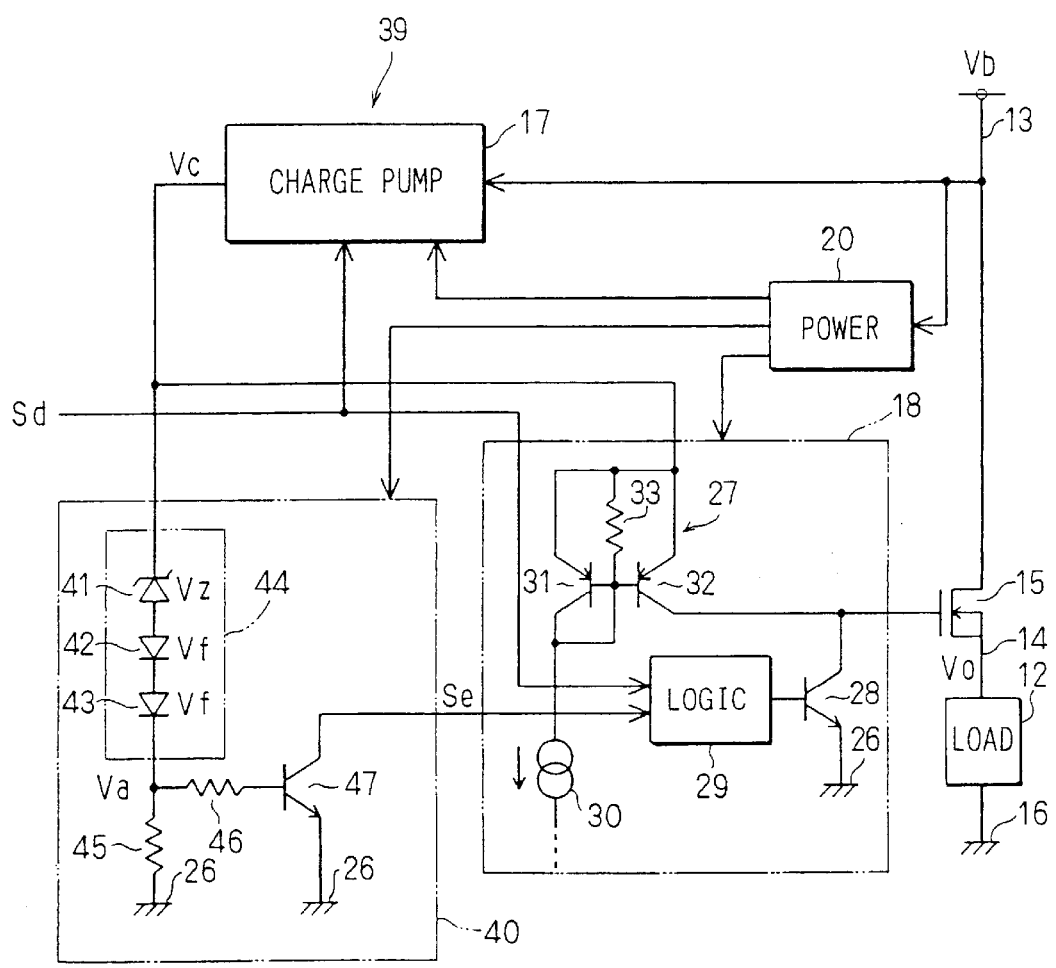
FIG. 4 is a circuit diagram of the electric construction of a load drive circuit showing a second embodiment of the present invention.

FIG. 4 schematically shows the electric construction of a load drive circuit. The load drive circuit 39 shown here and the load drive circuit 11 in the first embodiment shown in FIG. 1 differ from each other in the construction of a low voltage detecting circuit. In FIG. 4, the same constructional portions as FIG. 1 are designated by the same reference numerals.

The low voltage detecting circuit 40 of the load drive circuit 39 is constructed as follows. Namely, a series circuit 44 of a Zener diode 41 and diodes 42, 43, and a resistor 45 are connected in series as a voltage detecting circuit (a diode voltage lowering circuit) between the output terminal of a charge pump circuit 17 and a ground terminal 26. A common connection point of the series circuit 44 and the resistor 45 is connected to the base of an NPN type transistor 47 (corresponding to a reference voltage generating circuit and a comparing circuit) through a resistor 46. An emitter and a collector of this transistor 47 are respectively connected to the ground terminal 26 and a drive circuit 18. The collector of the transistor 47 is pulled up by an unillustrated resistor within the drive circuit 18.

In the above construction, when a Zener voltage of the Zener diode 41 is set to Vz and forward voltages of the diodes 42, 43 and the voltage between the base and the emitter of the transistor 47 are set to Vf, the low voltage detecting circuit 40 is operated as follows.

(a) Case of Raising Voltage $Vc \geq Vz+3 \cdot Vf$

An electric current flows from the output terminal of the charge pump circuit 17 through the series circuit 44 and the resistor 45, and a both-end voltage of the resistor 45, i.e., a detecting voltage Va becomes $Vc-Vz-2\cdot Vf$. In this case, since the detecting voltage Va is equal to or greater than Vf, the transistor 47 becomes a turning-on state, and a low voltage detecting signal Se outputted from the collector of the transistor 47 becomes a low voltage level.

(b) Case of $Vz+3\cdot Vf >$ Raising Voltage $Vc \geq Vz+2\cdot Vf$

Similar to the above case (a), an electric current flows through the series circuit 44 and the resistor 45, and the detecting voltage Va becomes $Vc-Vz-2\cdot Vf$. In this case, since the detecting voltage Va is smaller than Vf, the transistor 47 becomes a turning-off state, and the low voltage detecting signal Se becomes a high voltage level.

(c) Case of $Vz+2\cdot Vf >$ Raising Voltage Vc

Electric current does not flow through the series circuit 44 and the resistor 45, and the detecting voltage Va becomes 0 V. Accordingly, the transistor 47 attains a turning-off state, and the low voltage detecting signal Se becomes a high voltage level.

From the above (a) to (c), the threshold value Vt of the raising voltage Vc in the low voltage time output off function becomes $Vz+3\cdot Vf$, and its threshold value Vt is set such that this threshold value Vt becomes a value corresponding to the threshold value Vd of the battery voltage Vb.

Figure 5:
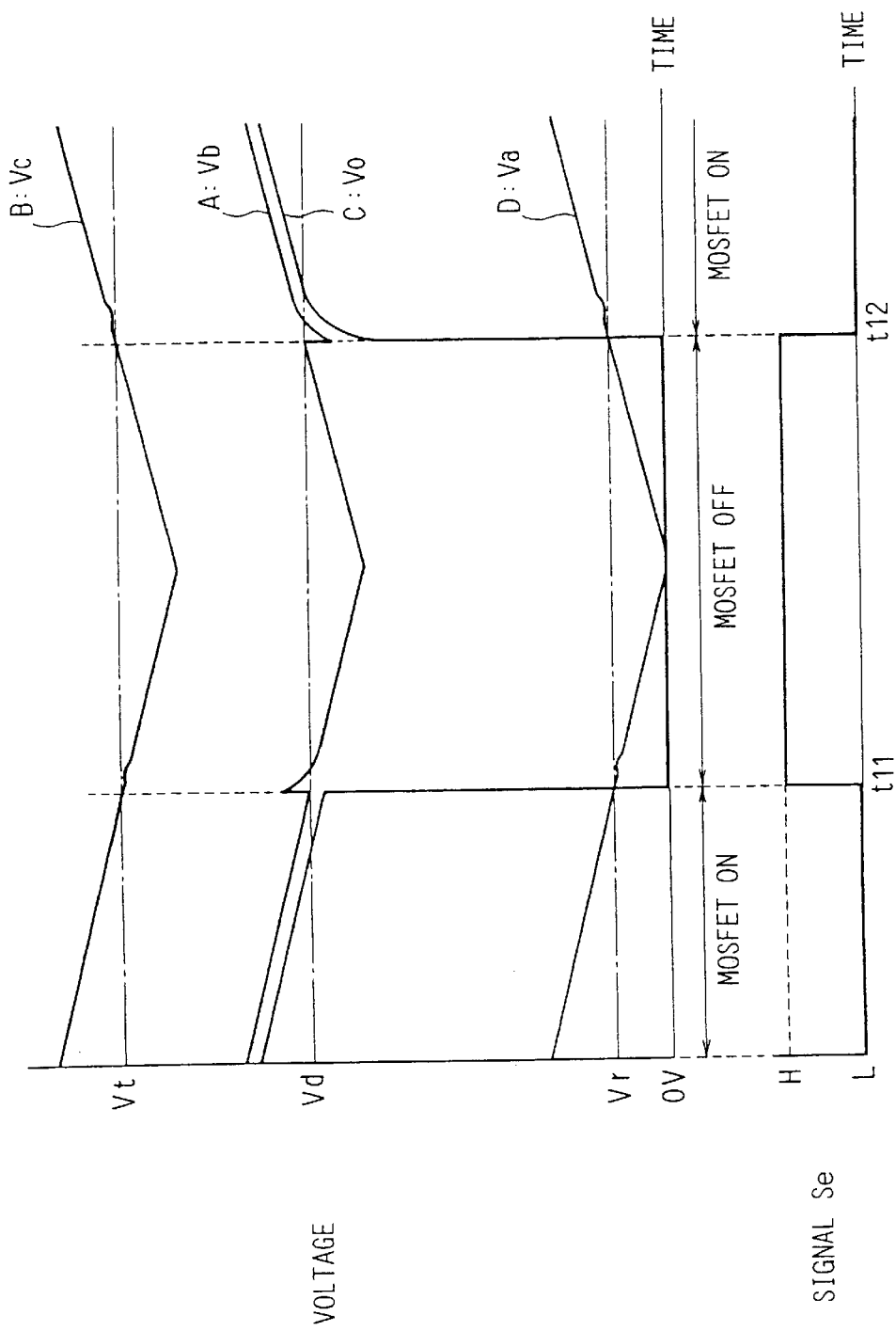
FIG. 5 is a voltage waveform of each portion and a state of a low voltage detecting signal Se when a drive command signal Sd has a high voltage level and a battery voltage Vb is lowered and raised near a threshold value Vd in the second embodiment.

Similar to FIG. 3, FIG. 5 shows a voltage waveform of each portion and a state of the low voltage detecting signal Se when a drive command signal Sd has a high voltage level and the battery voltage Vb is lowered near the threshold value Vd and is then raised. Waveforms A to D in this FIG. 5 respectively show the same voltages as the waveforms A to D in FIG. 3. However, the detecting voltage Va is a both-end voltage of the resistor 45 as mentioned above, and the reference voltage Vr is set to the voltage Vf (about 0.7 V) between the base and the emitter of the transistor 47 required to turn on the transistor 47.

In this FIG. 5, since the raising voltage Vc (detecting voltage Va) becomes lower than the threshold value Vt (threshold value Vr) between times t11 and t12, the low voltage detecting circuit 40 detects a low voltage state, and the low voltage detecting signal Se becomes a high voltage level. Further, since the raising voltage Vc (detecting voltage Va) is equal to or greater than the threshold value Vt (threshold value Vr) before the time t11 and after the time t2, the low voltage detecting signal Se becomes a low voltage level. The drive circuit 18 turns the MOSFET 15 on and off on the basis of this low voltage detecting signal Se and the drive command signal Sd.

In this embodiment, the low voltage detecting circuit 40 also does not directly detect the battery voltage Vb, but detects the raising voltage Vc of the charge pump circuit 17 so that the low voltage detecting circuit 40 indirectly detects the low voltage state with respect to the battery voltage Vb. Accordingly, operations and effects similar to those in the first embodiment can be obtained with respect to the low voltage time output off function, particularly, the on-off operation of the MOSFET 15 at a detecting start time point or a detecting termination time point of the low voltage state.

(Third Embodiment)

Figure 6:
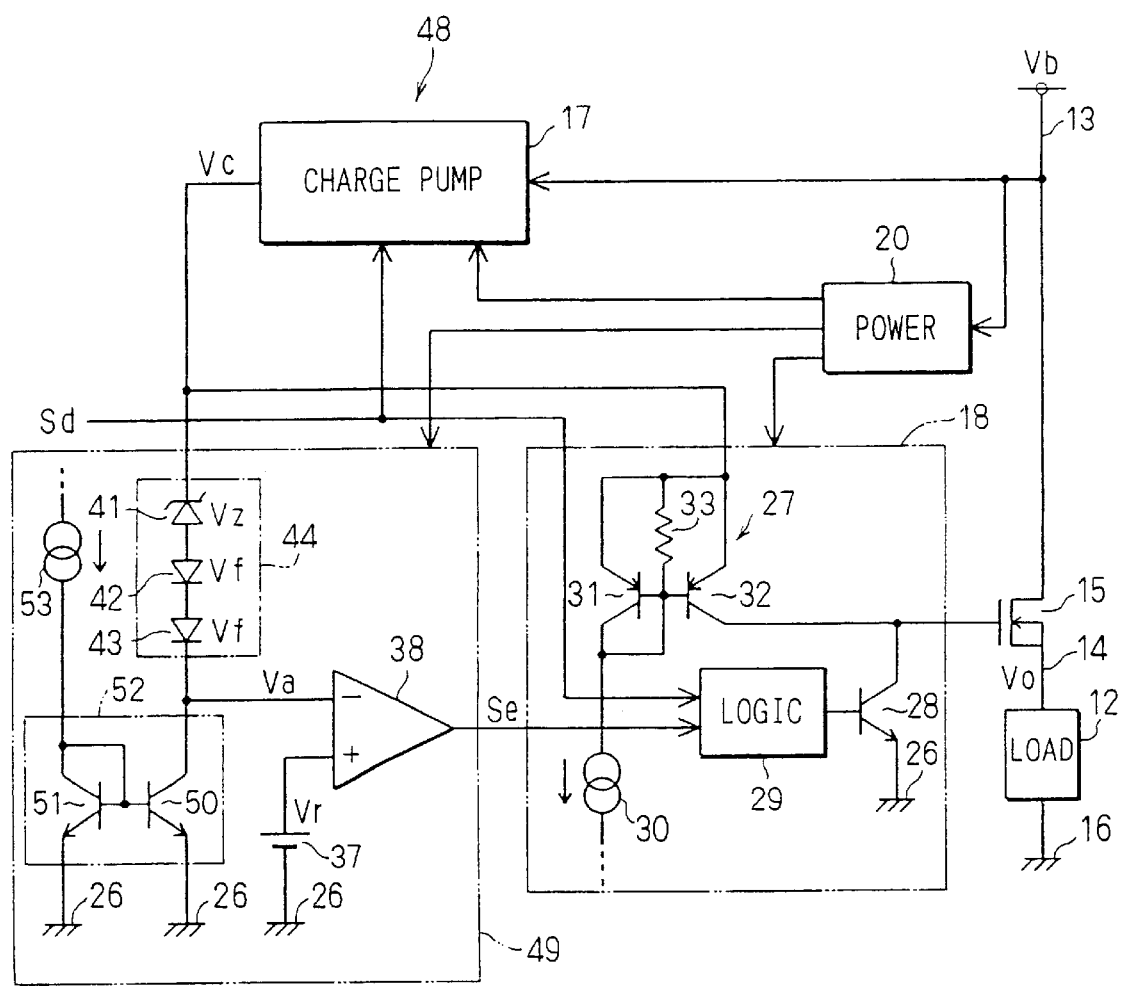
FIG. 6 is a circuit diagram of the electric construction of a load drive circuit showing a third embodiment of the present invention.

A third embodiment of the invention will next be explained with respect to constructional portions different from those in the first and second embodiments with reference to FIGS. 6 and 7. In FIG. 6, the same constructional portions as FIG. 1 or 4 are designated by the same reference numerals.

A load drive circuit 48 shown in FIG. 6 differs from the load drive circuits 11, 39 respectively shown in FIGS. 1 and 4 in the construction of a low voltage detecting circuit. The low voltage detecting circuit 49 of the load drive circuit 48 is constructed as follows. Namely, the above series circuit 44 and a portion between the collector and the emitter of an NPN type transistor 50 are connected in series between the output terminal of a charge pump circuit 17 and a ground terminal 26. A detecting voltage Va is obtained at a common connection point of the series circuit 44 and the collector of the transistor 50, and this common connection point is connected to an inversion input terminal of a comparator 38. Transistors 50 and 51 constitute a current mirror circuit 52, and a constant electric current flows from a constant electric current source 53 to a collector of the transistor 51 on an input side of this current mirror circuit 52.

In accordance with this construction, when a raising voltage Vc is equal to or greater than Vz+2·Vf, the same constant electric current as an electric current outputted from the constant electric current source 53 flows from an output terminal of the charge pump circuit 17 through the series circuit 44 and the transistor 50, whereby the detecting voltage Va becomes Vc−Vz−2·Vf. In contrast to this, when the raising voltage Vc is smaller than Vz+2·Vf, no electric current flows to the series circuit 44, and the detecting voltage Va becomes a saturation voltage VCE (sat) (about 0 V) of the transistor 50. In this embodiment, a reference voltage Vr of a reference voltage generating circuit 37 is set to Vt−Vz−2·Vf.

Figure 7:
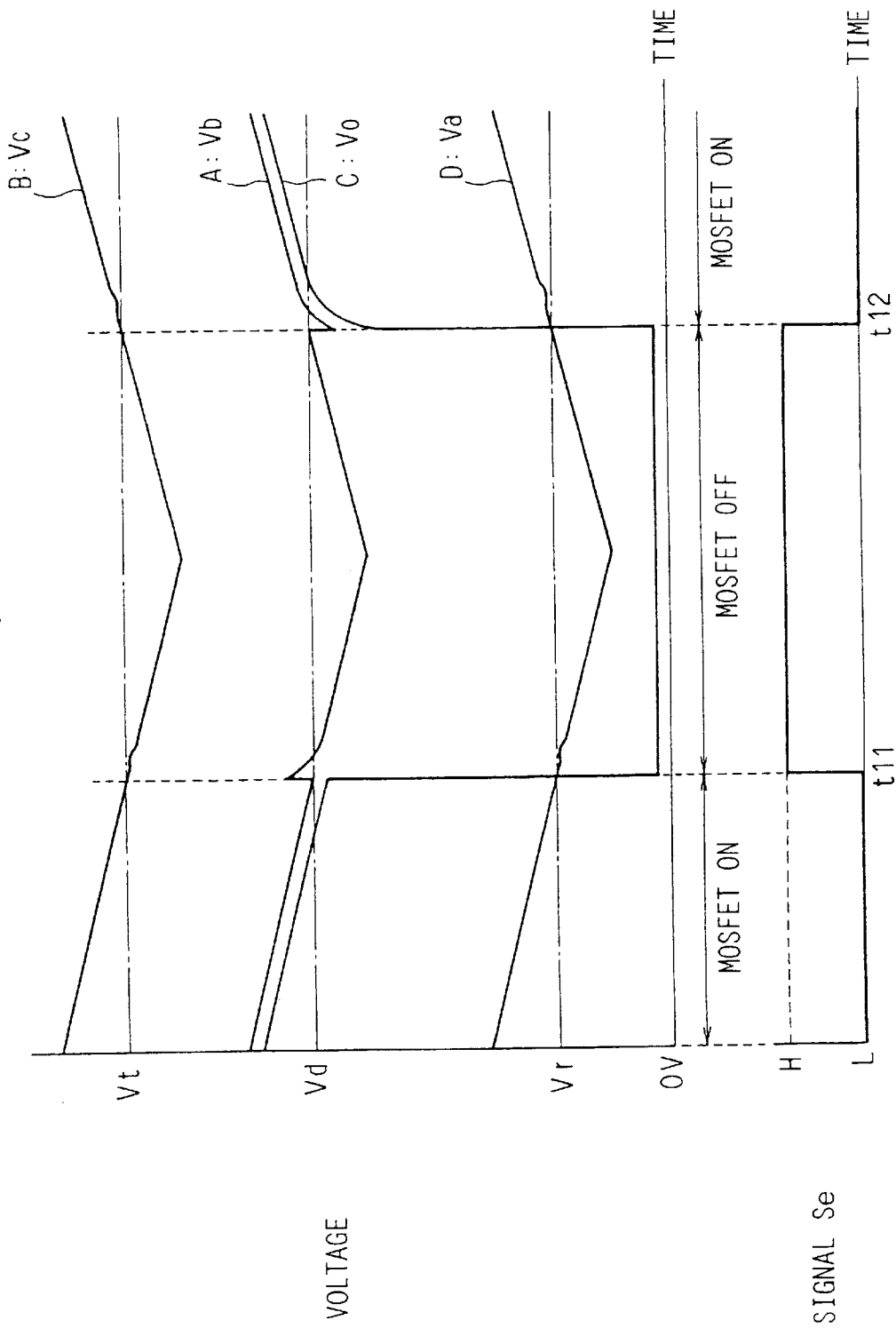
FIG. 7 is a voltage waveform of each portion and a state of a low voltage detecting signal Se when a drive command signal Sd has a high voltage level and a battery voltage Vb is lowered and raised near a threshold value Vd in the third embodiment.

FIG. 7 shows a voltage waveform of each portion and the state of a low voltage detecting signal Se in a case similar to FIG. 3. Waveforms A to D in this FIG. 7 respectively show the same voltages as the waveforms A to D in FIG. 3.

In this embodiment, the low voltage detecting circuit 49 also indirectly detects a low voltage state with respect to a battery voltage Vb by detecting a raising voltage Vc of the charge pump circuit 17. Accordingly, it is possible to obtain operations and effects similar to those in the first and second embodiments with respect to a low voltage time output off function.

When an electric current flows from the output terminal of the charge pump circuit 17 through the series circuit 44 and the transistor 50, its electric current value becomes constant irrespective of the magnitude of the raising voltage Vc. Since the charge pump circuit 17 has a relatively high output impedance, an output electric current of the charge pump circuit 17 is constantly set so that a reduction in the raising voltage Vc due to this output electric current can be prevented.

(Fourth Embodiment Mode)

Figure 8:
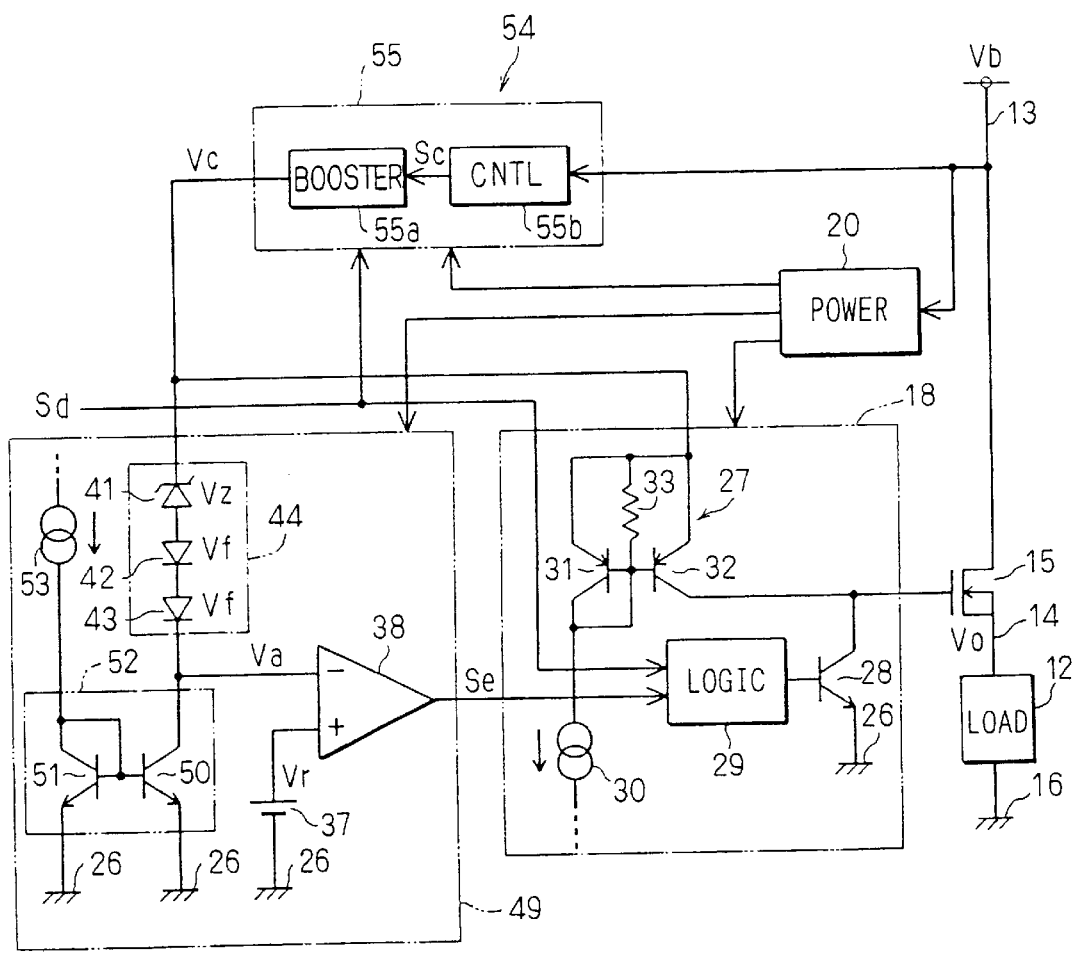
FIG. 8 is a circuit diagram of the electric construction of a load drive circuit showing a fourth embodiment of the present invention.

A fourth embodiment adding a change to the third embodiment will next be explained with reference to FIGS. 8 and 9. In FIG. 8 showing the electric construction of a load drive circuit, the same constructional portions as FIG. 6 are designated by the same reference numerals, and different constructional portions will be explained here.

The load drive circuit 54 shown in FIG. 8 differs from the load drive circuit 48 shown in FIG. 6 in the construction of a charge pump circuit. The charge pump circuit 55 of the load drive circuit 54 is constructed by a booster circuit 55a having the same construction as the charge pump circuit 17 shown in the first to third embodiments, and a control circuit 55b for controlling a voltage raising operation of this booster circuit 55a.

The control circuit 55b is constructed by a detecting circuit of the battery voltage Vb, a reference voltage generating circuit, and a comparator (which are not shown in the drawings). The reference voltage generating circuit generates a reference voltage corresponding to a threshold value Vh (corresponding to a raising voltage start level). The comparator compares the detected battery voltage Vb and the reference voltage, and outputs a raising voltage control signal Sc. The threshold value Vh in this case is set to be higher than the threshold value Vd.

The booster circuit 55a executes the voltage raising operation in accordance with this raising voltage control signal Sc when the battery voltage Vb is equal to or greater than the threshold value Vh. The booster circuit 55a stops the voltage raising operation when the battery voltage Vb is smaller than the threshold value Vh. The booster circuit 55a stops the voltage raising operation irrespective of the raising voltage control signal Sc in a period in which the drive command signal Sd has a low voltage level.

Figure 9:
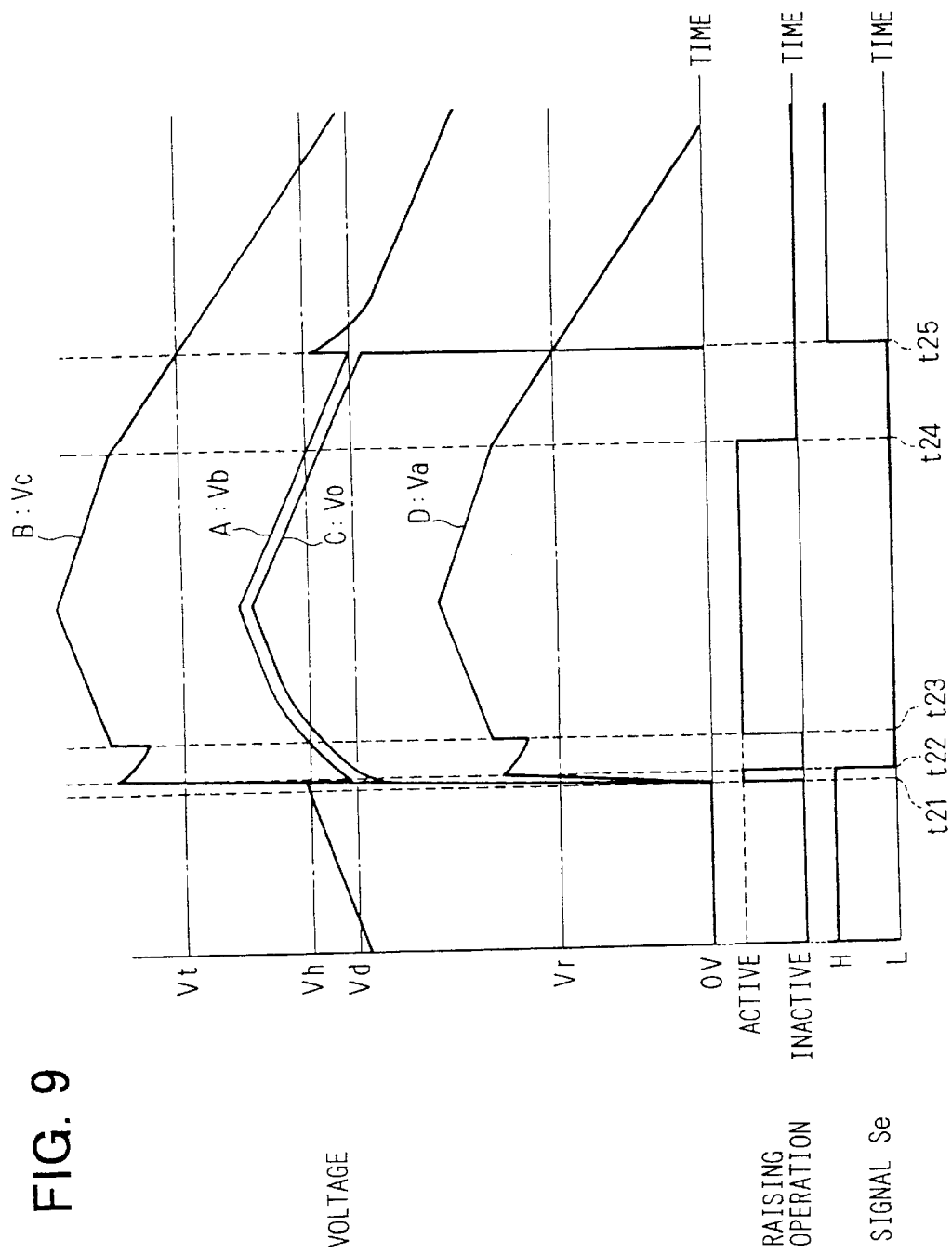
FIG. 9 is a voltage waveform of each portion, a voltage raising operation state of a booster circuit 55a, and a state of a low voltage detecting signal Se when a drive command signal Sd has a high voltage level and a battery voltage Vb is raised and lowered near a threshold value Vh in the fourth embodiment.
Figure 10:
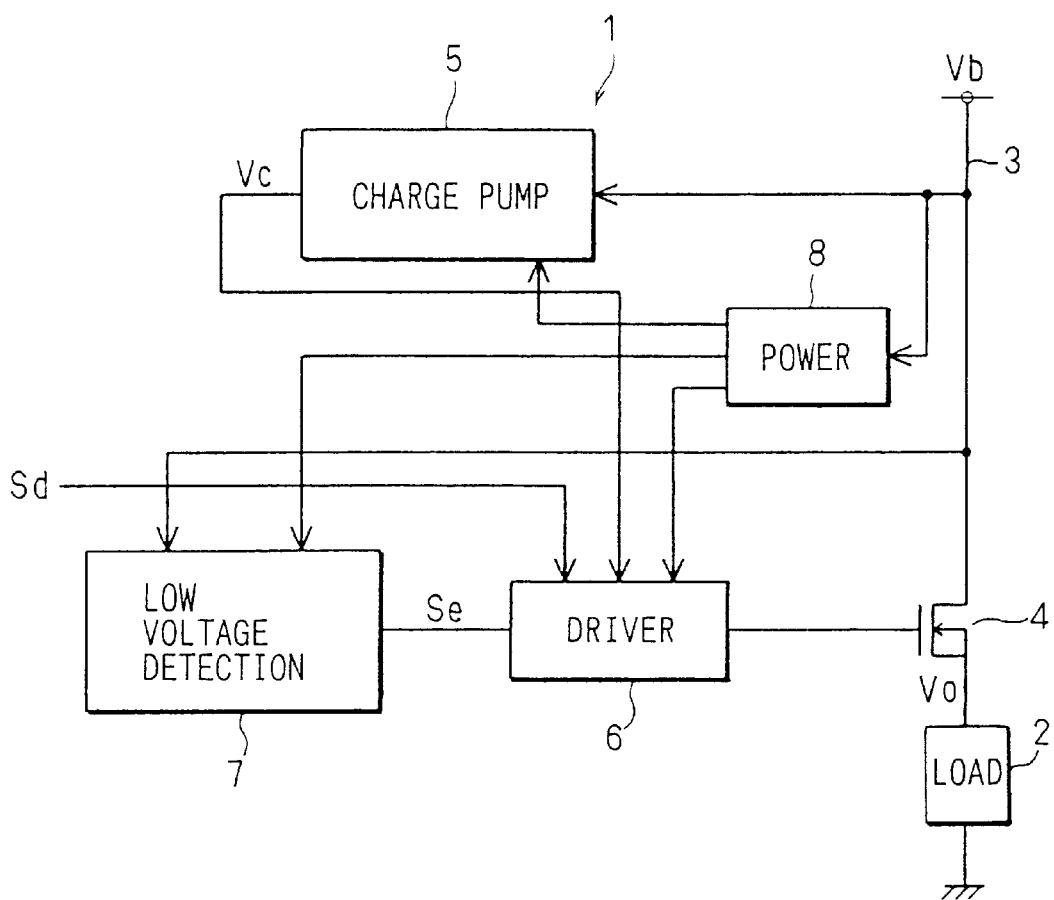
FIG. 10 is a circuit diagram of the electric construction of a load drive circuit showing the related art.
Figure 11:
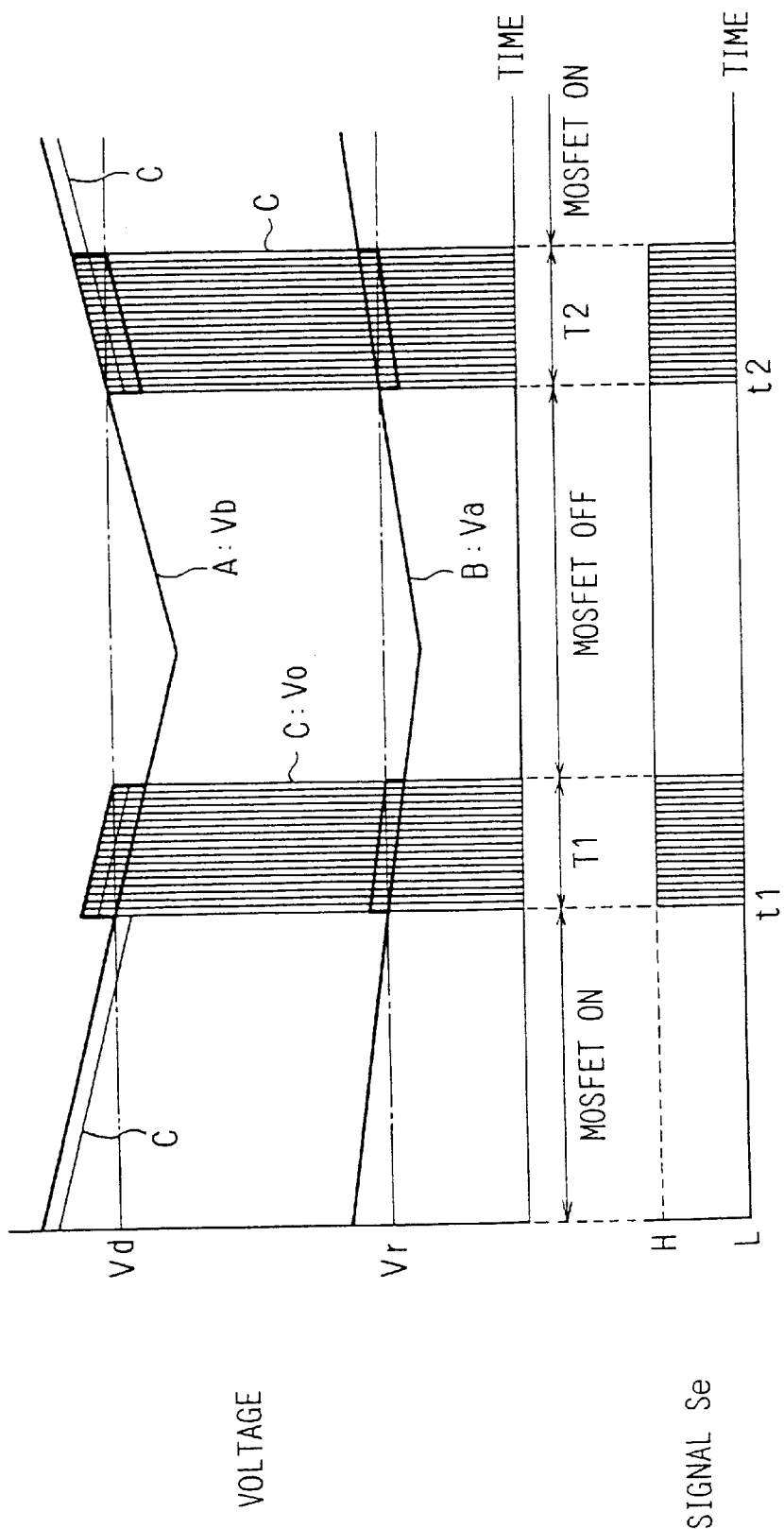
FIG. 11 is a voltage waveform of each portion and a state of a low voltage detecting signal Se when a drive command signal Sd has a high voltage level and a battery voltage Vb is lowered and raised near a threshold value Vd in the related art.

FIG. 9 shows a voltage waveform of each portion, a voltage raising operation state of the booster circuit 55a and the state of a low voltage detecting signal Se when the drive command signal Sd has a high voltage level and the battery voltage Vb is raised near the threshold value Vh and is then lowered. Waveforms A to D in this FIG. 5 respectively show voltages of the same kind as the waveforms A to D in FIG. 3.

Before a time t21, the battery voltage Vb is smaller than the threshold value Vh so that the booster circuit 55a stops the voltage raising operation and the raising voltage Vc is 0 V. Therefore, the low voltage detecting signal Se outputted from the low voltage detecting circuit 49 becomes a high voltage level (a low voltage detecting state), and the MOSFET 15 becomes a turning-off state.

When the battery voltage Vb is equal to or greater than the threshold value Vh at the time t21, the booster circuit 55a starts the voltage raising operation, and the charge pump circuit 55 outputs the raising voltage Vc based on the battery voltage Vb (=Vh) at that time. As mentioned above, since the threshold value Vh is set to be higher than the threshold value Vd, the raising voltage Vc (detecting voltage Va) at this time is higher than the threshold value Vt (reference voltage Vr) corresponding to the threshold value Vd of the battery voltage Vb. Therefore, the low voltage detecting signal Se is changed from a high voltage level to a low voltage level, and the MOSFET 15 is changed from a turning-off state to a turning-on state (time t22).

At this time, as explained in the first embodiment, a phenomenon of temporarily jumping down the voltage (battery voltage Vb) of the power line 13 is generated by a sudden increase in a load electric current. The battery voltage Vb becomes a state lower than the threshold value Vh for a time from this time to a time t23 so that the booster circuit 55a stops the voltage raising operation and the raising voltage Vc is therefore reduced. However, the booster circuit 55a accumulates electric charges to its voltage raising capacitors 22a to 22e, and it is prevented by diodes 21a to 21e that the electric charges reversely flow to an input side. Accordingly, the raising voltage Vc is not suddenly reduced, but is gradually reduced.

Further, the threshold value Vh is set to be higher than the threshold value Vd. Accordingly, even when the raising voltage Vc (detecting voltage Va) is reduced, this raising voltage is not immediately reduced until its threshold value Vt (reference voltage Vr). The battery voltage Vb temporarily jumped down is restored until the threshold value Vh at a time t23 before the raising voltage Vc is reduced to the threshold value Vt. Thus, the booster circuit 55a again starts the voltage raising operation.

In contrast to this, when the battery voltage Vb is reduced and is smaller than the threshold value Vh after a time t24, the booster circuit 55a stops the voltage raising operation, and the raising voltage Vc is gradually reduced. Thereafter, the low voltage detecting signal Se holds the low voltage level and the MOSFET 15 is continuously turned on for a time until a time t25 at which the raising voltage Vc (battery voltage Vb) is lower than the threshold value Vt (threshold value Vd).

When the low voltage detecting state is set and the MOSFET 15 is changed from the turning-on state to the turning-off state at the time t25, the battery voltage Vb is temporarily jumped up by a sudden reduction in the load electric current. However, since the threshold value Vh is set to be higher than the threshold value Vd, battery voltage Vb is not equal to or greater than the threshold value Vh even when the battery voltage Vb is jumped up. Accordingly, the booster circuit 55a does not restart the voltage raising operation.

As explained above, the charge pump circuit 55 in this embodiment is constructed such that this charge pump circuit 55 executes the voltage raising operation in a period in which the battery voltage Vb is equal to or greater than the threshold value Vh. Further, this threshold value Vh is set to be higher than the threshold value Vd of the battery voltage Vb in the low voltage time output off function. Thus, when the low voltage time output off function is operated and on-off operating states of the MOSFET 15 are changed, voltage variation of the battery voltage Vb is not further easily detected. Accordingly, it is possible to more reliably prevent the generation of an oscillating state alternately repeating the turning-on and the turning-off of the MOSFET 15.

(Other Embodiment Modes)

The MOSFET 15 is used as a switch circuit (switching element), but an IGBT, a bipolar transistor, or the like may be also used instead of the MOSFET. Further, the switch circuit is not limited to a semiconductor switching element, but a relay switch turned on and off by using e.g., the raising voltage Vc may be also used as the switch circuit.

Power source connected to the power line 13 is not limited to the battery. Further, the charge pump circuit 17 (booster circuit 55a) is not limited to the circuit construction shown in FIG. 2, but another circuit construction may be also used if this circuit is constructed by a diode and a capacitor for preventing the back flow of electric charges. Further, the charge pump circuits 17, 55 may also perform the voltage raising operation at any time irrespective of the voltage level of the drive command signal Sd.

With respect to the series circuit 44 in the low voltage detecting circuits 40, 49, each series connecting number of the Zener diode and the diode and their combination may be also suitably changed. Further, a detecting voltage Va lower by a predetermined voltage than the raising voltage Vc may be also obtained by connecting a resistor between the output terminal of the charge pump circuit 17 and the ground terminal 26, and flowing a constant electric current through this resistor.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A load drive circuit comprising:
    a charge pump circuit for receiving a power voltage from a power source, increasing the power voltage and outputting an output voltage;
    a low voltage detecting circuit for receiving the output voltage from said charge pump circuit and outputting an output signal to indicate whether the output voltage of the charge pump circuit is in a low voltage state or a high voltage state, wherein said low voltage state is for indicating the output voltage of said charge pump circuit is lower than a predetermined level; and
    a switch circuit located in a power supply path for connecting said power source and a load for setting said power supply path to an opening state or a closing state based on a drive command signal, the output signal from said low voltage detecting circuit and the output voltage of said charge pump circuit; and
    wherein when said low voltage detecting circuit detects said low voltage state, said switch circuit sets said power supply path to the opening state irrespective of said drive command signal, and said drive command signal instructs said charge pump circuit to increase said power voltage.

2. A load drive circuit according to claim 1, wherein said switch circuit is constructed by a switching element arranged in said power supply path, and an element drive circuit for switching turning-on and turning-off states of said switching element in accordance with said drive command signal.

3. The load drive circuit according to claim 1, wherein said low voltage detecting circuit includes a voltage detecting circuit for detecting the output voltage of said charge pump circuit and outputting a detected voltage, a reference voltage generating circuit for generating a reference voltage corresponding to said predetermined level, and a comparing circuit for comparing said detected voltage and said reference voltage.

4. A load drive circuit according to claim 3, wherein said voltage detecting circuit is a resistor voltage dividing circuit.

5. A load drive circuit according to claim 3, wherein said voltage detecting circuit is a diode voltage lowering circuit having a diode and a resistor connected in series.

6. A load drive circuit according to claim 3, wherein said voltage detecting circuit is a diode voltage lowering circuit operated by a constant electric current.

7. The load drive circuit according to claim 1, wherein said charge pump circuit is constructed such that said charge pump circuit performs a voltage increasing operation when said power voltage is equal to or greater than a predetermined increasing voltage start level; and the predetermined increasing voltage start level is set such that the output voltage of said charge pump circuit is higher than said predetermined level.

8. A load drive circuit comprising:

a charge pump circuit for receiving a power voltage from a power source, increasing the power voltage and outputting an output voltage;

a low voltage detecting circuit for receiving the output voltage from said charge pump circuit and outputting an output signal to indicate whether the output voltage of the charge pump circuit is in a low voltage state or high voltage state, wherein said low voltage state is for indicating the output voltage of said charge pump circuit is lower than a predetermined level; and a switch circuit located in a power supply path for connecting said power source and a load for setting said power supply path to an opening state or a closing state based on a drive command signal, the output signal from said low voltage detecting circuit and the output voltage of said charge pump circuit;

wherein said switch circuit is constructed such that said switch circuit sets said power supply path to the opening state irrespective of said drive command signal in a period in which said low voltage detecting circuit detects said low voltage state, and said low voltage detecting circuit includes a constant current diode voltage lowering circuit as a voltage detection circuit for detecting the output voltage of said charge pump circuit and outputting a detected voltage, a reference voltage generating circuit for generating a reference voltage corresponding to said predetermined level, and a comparing circuit for comparing said detected voltage and said reference voltage.

9. The load drive circuit according to claim 8, wherein said switch circuit comprises a switching element arranged in said power supply path, and an element drive circuit for switchably opening and closing said switching element in accordance with said drive command signal.

10. The load drive circuit according to claim 8, wherein said charge pump circuit is for performing a voltage increasing operation when said power voltage is equal to or greater than a predetermined increasing voltage start level; and the predetermined increasing voltage start level is set such that the output voltage of said charge pump circuit is higher than said predetermined level.

11. A load drive circuit comprising:

a charge pump circuit for receiving a power voltage from a power source, increasing the power voltage and outputting an output voltage;

a low voltage detecting circuit for receiving the output voltage from said charge pump circuit and outputting an output signal to indicate whether the output voltage of the charge pump circuit is in a low voltage state or a high voltage state, wherein said low voltage state is for indicating the output voltage of said charge pump circuit is lower than a predetermined level;

a switch circuit located in a power supply path for connecting said power source and a load for setting said power supply path to an opening state or a closing state based on a drive command signal, the output signal from said low voltage detecting circuit and the output voltage of said charge pump circuit, wherein the switch circuit is constructed by a switching element located in said power supply path and an element drive circuit for switchably opening and closing of said switching element based on said drive command signal; and a power supply circuit for receiving the power voltage from the power source and supplying control voltages to the element drive circuit of the switch circuit and the low voltage detecting circuit;

wherein said switch circuit sets said power supply path to the opening state irrespective of said drive command signal in a period in which said low voltage detecting circuit detects said low voltage state.

12. The load drive circuit according to claim 11, wherein said low voltage detecting circuit includes a voltage detecting circuit for detecting the output voltage of said charge pump circuit and outputting a detected voltage, a reference voltage generating circuit for generating a reference voltage corresponding to said predetermined level, and a comparing circuit for comparing said detected voltage and said reference voltage.

13. The load drive circuit according to claim 12, wherein said voltage detecting circuit comprises a resistor voltage dividing circuit.

14. The load drive circuit according to claim 12, wherein said voltage detecting circuit comprises a constant current diode voltage lowering circuit having a diode and a resistor connected in series.

15. The load drive circuit according to claim 12, wherein said voltage detecting circuit comprises a constant current diode voltage lowering circuit operated by a constant electric current.

16. The load drive circuit according to claim 11, wherein said charge pump circuit is for performing a voltage increasing operation when said power voltage is equal to or greater than a predetermined increasing voltage start level; and the predetermined increasing voltage start level is set such that the output voltage of said charge pump circuit is higher than said predetermined level.

17. A method for driving a load connected to a battery through a switch circuit, the method comprising:

increasing a voltage of the battery by a charge pump circuit and outputting an increased output voltage;

detecting whether the increased output voltage of the charge pump circuit is in a low voltage state or a high voltage state relative to a predetermined voltage level; and controlling an on-off switching state of the switch circuit in response to both a drive command signal for the switch circuit and an output signal generated based on the detecting whether the increased output voltage of the charge pump circuit is in the low voltage state or the high voltage state relative to the predetermined voltage level;

wherein the controlling an on-off state of the switch circuit forcibly turns off the switch circuit irrespective of the drive command signal, while the output signal generated based on the detecting whether the increased output voltage of the charge pump circuit is in the low voltage state or the high voltage state relative to the predetermined voltage level indicates that the increased output voltage is in the low voltage state.

* * * * *